US005739718A

United States Patent [19]
Chevroulet

[11] Patent Number: 5,739,718
[45] Date of Patent: Apr. 14, 1998

[54] INTEGRATED CIRCUIT IN WHICH SOME FUNCTIONAL COMPONENTS ARE MADE TO WORK WITH ONE AND THE SAME OPERATING CHARACTERISTIC

[75] Inventor: Michel Alain Chevroulet, Neuchatel, Switzerland

[73] Assignee: CSEM-Centre Suisse D'Electronique et de Microtechnique SA, Neuchatel, Switzerland

[21] Appl. No.: 649,478

[22] Filed: May 17, 1996

[30] Foreign Application Priority Data

May 17, 1995 [FR] France .................................. 95 05920

[51] Int. Cl.$^6$ .................................................. H03L 1/00

[52] U.S. Cl. ......................... 327/530; 327/537; 327/521; 327/566

[58] Field of Search ..................................... 327/530, 534, 327/535, 537, 538, 541, 543, 545, 546, 565, 566

[56] References Cited

U.S. PATENT DOCUMENTS

| | | | |
|---|---|---|---|
| 4,471,292 | 9/1984 | Schenck et al. | 323/315 |
| 4,814,644 | 3/1989 | Yamakawa | 307/355 |
| 5,157,285 | 10/1992 | Allen | 307/465 |
| 5,397,934 | 3/1995 | Merrill et al. | 327/534 |
| 5,461,338 | 10/1995 | Hirayama et al. | 327/538 |

FOREIGN PATENT DOCUMENTS

| | | |
|---|---|---|
| 0342814 | 11/1989 | European Pat. Off. . |
| 0454250 | 10/1991 | European Pat. Off. . |
| 0459715 | 12/1991 | European Pat. Off. . |
| 0647894 | 4/1995 | European Pat. Off. . |
| 0674252 | 9/1995 | European Pat. Off. . |
| 2071955 | 9/1981 | United Kingdom . |

*Primary Examiner*—Timothy P. Callahan
*Assistant Examiner*—T. T. Lam

[57] ABSTRACT

In an integrated circuit, a central reference generator (3) generates a setpoint signal determining the operating characteristic required to be common to some of the functional components of the circuit. Lines (4-1 to 4-n) distribute this signal among units of the circuit, each unit comprising a functional Component (2-n). In each unit, a local adjustment circuit (5-n) receives the setpoint signal and generates an adjustment value. Correction circuitry adjusts the operating characteristic of a device in the local adjustment circuit (5-n) as a function of the adjustment value. The device is placed in proximity to the functional component and configured in such a way that the operating characteristic which is thus imposed on the device is also imposed on this component.

16 Claims, 2 Drawing Sheets

INTEGRATED CIRCUIT IN WHICH SOME FUNCTIONAL COMPONENTS ARE MADE TO WORK WITH ONE AND THE SAME OPERATING CHARACTERISTIC

FIELD OF THE INVENTION

The present invention relates to integrated circuits in which some or all of the functional components or groups of components are required to work under the same conditions so as to ensure the proper operation of the circuit as a whole.

BACKGROUND OF THE INVENTION

When in an integrated circuit such as an MOS circuit, two components, for example two transistors, are located in proximity to each other, it is relatively easy to accord them the same operating conditions, for example the same characteristic curve for the drain current $I_D$ as a function of the gate voltage $V_G$.

On the other hand, when the components are distanced from one another within the circuit, or a fortiori, when many components are required to work under the same conditions, the parameters of the components will then be dependent on their topographical distance apart within the circuit, it being practically impossible for the circuit to be manufactured with the necessary uniformity. Furthermore, other factors, such as differences in temperature from place to place in a circuit, may induce a nonuniformity of the operating parameters of the components.

A technique which is used at present to impose identical operating characteristics on mutually distant transistors of an integrated circuit consists in imposing a parameter (for example a current) on them and a quantity which determines the characteristic (for example the gate voltage) is adjusted. This method has the drawback that the control current cannot be utilized simultaneously by both transistors and they must therefore be controlled alternately. Therefore the transistors are only available to perform the function assigned to them within the circuit if they are not in the regulation regime. Moreover, the number of transistors which can thus be made to work under the same conditions is strictly limited, since otherwise the frequency with which the control current is sequentially distributed will become too high in relation to that of the useful signal to be processed.

This known method therefore has certain drawbacks.

The purpose of the invention is to provide an integrated circuit which includes means for imposing one and the same operating characteristic on a plurality of its components or groups of components, this circuit being without the drawbacks of the prior technique described briefly above.

SUMMARY OF THE INVENTION

The subject of the invention is therefore an integrated circuit which comprises:

- means forming a central reference generator intended to generate at least one setpoint item which determines the operating characteristic required to be common to all the functional components of the circuit;
- means for distributing the setpoint item among a plurality of units of the circuit, each unit comprising at least one of said functional components;
- each of said units comprising local adjustment means connected to receive said setpoint item and to generate an adjustment value;
- correction means in each unit in order to adjust the operating characteristic of a device, provided for in said local adjustment means, as a function of said adjustment value, said device being placed in proximity to the functional component(s) and configured in such a way that the operating characteristic which is thus imposed on it is also imposed on the functional component(s);
- correction means in each unit in order to adjust the operating characteristic of its functional component(s) as a function of said adjustment value.

BRIEF DESCRIPTION OF THE DRAWINGS

Other characteristics and advantages of the invention will emerge in the course of the following description given merely by way of example and made whilst referring to the appended drawings in which.

Figure 1:
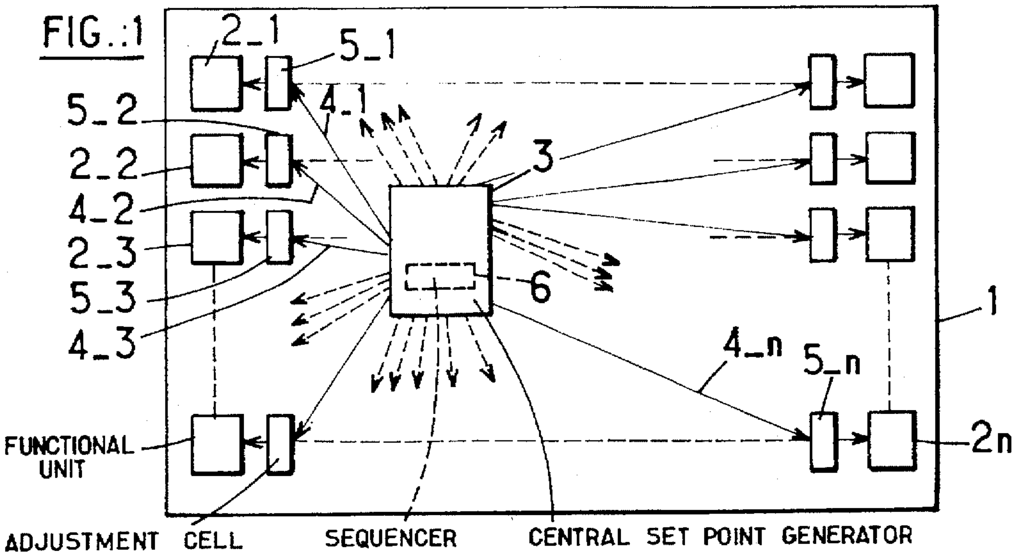
FIG. 1 is a very simplified diagram of an integrated circuit in order to demonstrate the essential characteristics of the invention.

Represented in FIG. 1 is a very simplified general diagram of an integrated circuit including a system according to the invention.

The integrated circuit symbolized by the rectangle 1 includes a plurality of functional units 2-1 to 2-n distributed over the integrated circuit and it is assumed that they are all required to work with one and the same operating characteristic.

In this context, it should be noted that integrated circuit is understood to mean any functional assembly which may comprise one or more chips, the functional units possibly being components or groups of components of any kind, such as transistors, diodes, groups of transistors, groups of diodes, circuit parts composed of assemblages of such components etc. Furthermore, although FIG. 1 shows a regular distribution of its functional units, this is not a limiting element of the concept of the invention, it being possible for these units to be installed within the circuit solely depending on the specific requirements and tasks which the integrated circuit is required to accomplish.

According to the invention, the integrated circuit includes a central setpoint generator 3 installed at an appropriate place in this circuit and intended to generate a setpoint signal as a function of which the operating characteristic of the functional units will be generated. This generator includes n outputs connected to as many lines 4-1 to 4-n which are respectively connected to local adjustment cells 5-1 to 5-n. These cells are respectively associated with the functional units 2-1 to 2-n, being placed near their respective unit.

The setpoint item generated in the central generator 3 can be applied simultaneously to the adjustment cells 5-1 to 5-n, but according to one particular characteristic of the invention, it can also be dispatched sequentially to these cells, in which case the central generator 3 includes a sequencer 6 represented dashed within the rectangle which symbolizes the setpoint generator 3. This variant of the invention is especially useful when the setpoint item cannot be used without being adversely affected by several adjustment cells at the time.

It should be noted that in an integrated circuit comprising a system according to the invention, the functional units remain permanently operational, even if the setpoint item reaches their associated adjustment cell only sequentially.

Several examples of the application of the concept according to the invention will now be described.

Concerning a first of these examples, it will be observed that often, owing to a certain technological randomness, the threshold voltages of the transistors of a MOS integrated circuit are not the same over the whole extent of the circuit. The first example described is consequently aimed at imposing one and the same so-called "apparent" threshold voltage on all the transistors of the circuit. In this first example it is thus assumed that the characteristic requiring to be imposed on the transistors of the circuit (which, here, are the functional units) is this apparent threshold voltage. Adjustment of the threshold voltages of all the transistors to one and the same value allows the simplified exchange of analog information between various parts of the integrated circuit, this information being thus interpreted in the same way everywhere in the circuit.

It is known that an n-type MOS transistor operating under strong inversion allows a drain current $I_D$ to flow exhibiting the following relation:

$$I_D=k(V_G-V_{TA})^2 \tag{1}$$

in which $I_D$ is the drain current of the transistor, $V_G$ its gate voltage and $V_{TA}$ its apparent threshold voltage as long as $V_G>>V_{TA}$, that is to say when the transistor is working under strong inversion.

It is also known that the apparent threshold voltage $V_{TA}$ of a MOS transistor is defined by the following relation:

$$V_{TA}=V_T+nV_s-(n-1)V_w \tag{2}$$

in which $V_T$ is the "physical" threshold voltage of the transistor, $V_S$ its source voltage, $V_W$ the well voltage and n the coupling coefficient defined as follows:

$$n=1+\frac{C_D}{C_i} \tag{3}$$

In relation (3), $C_D$ is the depletion capacitance of the transistor and $C_i$ its oxide capacitance.

It should be noted that the same relations may be written, mutatis mutandis, for a p-type transistor.

It follows from relation (2) above that the apparent threshold voltage $V_{TA}$ of all the transistors of the circuit can be determined by adjusting the well voltage $V_W$.

In the first example described of the application of the invention, it is this property which is exploited in order to adjust the threshold voltage of all the useful transistors of the integrated circuit and use is made for this purpose of the circuit which will now be described with reference to FIG. 2.

For the sake of simplicity, this figure depicts only the setpoint generator 3 together with a single useful transistor 2-n with its associated local adjustment cell 5-n.

Figure 2:
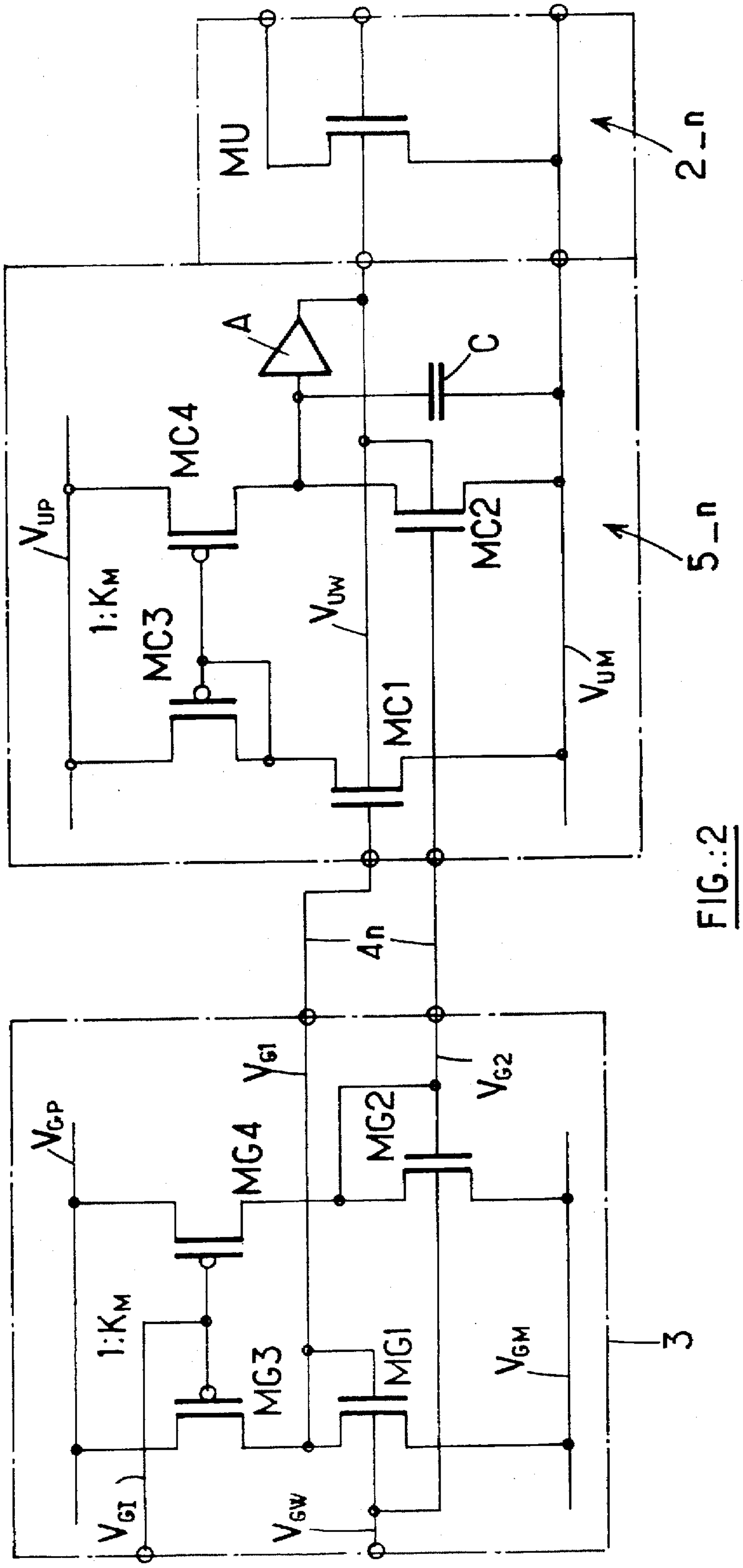

The setpoint generator 3 depicted in FIG. 2 is intended for n-type transistors. It includes twotransistors MG1 and MG2 whose sources are connected to a negative supply conductor of voltage $V_{GM}$. Their drains are connected to their respective gates and to the drains of two respective transistors MG3 and MG4 mounted as a current mirror. The wells of the transistors MG1 and MG2 are joined to a supply terminal $V_{GW}$. The gates of the transistors MG3 and MG4 are joined to a terminal of bias voltage $V_{GI}$, whilst their sources are joined to a positive supply voltage $V_{GP}$.

As the transistors MG1 to MG4 are placed very near to one another in the integrated circuit, their apparent threshold voltages are pairwise identical.

Furthermore, since the transistors have a specified width ratio, they conduct currents $I_{MG3}$ and $I_{MG4}$ having this ratio:

$$K_m=\frac{I_{MG4}}{I_{MG3}} \tag{4}$$

The transistors MG1 and MG2 will conduct currents $I_{MG3}$ and $I_{MG4}$ which determine the respective gate voltages $V_{G1}$ and $V_{G2}$. Indeed, it follows from equations (1) and (2) above that these voltages are connected in the strong inversion regime by the relation:

$$K_M=\left(\frac{V_{G1}-V_T-nV_s+(n-1)V_W}{V_{G2}-V_T-nV_S+(n-1)V_W}\right)^2 \tag{5}$$

Thus, the voltages $V_{G1}$ and $V_{G2}$ can constitute a setpoint item which can be exploited in the local adjustment cell 5-n in order to determine, for the useful transistor 2-n associated therewith, an identical apparent threshold voltage $V_{TA}$ by using the well voltage $V_W$ as adjustment parameter, the actual threshold voltages of all the useful transistors possibly differing from one cell to another.

The local adjustment cell 5-n includes a current mirror formed from the transistors MC3 and MC4 whose widths are in a ratio $K_M$. This is relatively easy to achieve even if the distance which separates the setpoint generator 3 from this local cell is relatively large.

The sources of these transistors MC3 and MC4 are connected to a supply voltage $V_{UP}$, whilst their drains are connected respectively to the drains of two transistors MC1 and MC2 whose sources are connected to a voltage $V_{UM}$. The gate of the transistor MC3 is connected to its drain. The gates of the transistors MC1 and MC2 are connected respectively to the voltages $V_{G1}$ and $V_{G2}$ originating from the setpoint generator 3.

The point common to the transistors MC2 and MC4 is linked up to the input of an amplifier A and to a terminal of a capacitor C. The output of the amplifier A is connected to the wells of the transistors MC1, MC2 and MU.

In this adjustment cell 5-n, the transistors MC1 and MC2 operate under strong inversion and produce respective currents determined by relation (1) above. The current mirror formed by the transistors MC3 and MC4 makes a copy of the current produced by the transistor MC1 while multiplying it by the constant $K_M$. In the adjustment regime, the capacitor C integrates the difference between the current flowing through the transistor MC4 and the current flowing through MC2. The amplifier sends the corresponding value to the wells of the transistors MC1 and MC2 and also to that of the useful transistor MU. The system stabilizes when the difference between these currents is zero. Under these conditions, the transistor MU exhibits an apparent threshold voltage which is identical to that of the transistors MG1 and MG2 of the setpoint generator.

Thus by associating an adjustment cell such as the cell 5-n with each useful transistor or with each group of useful transistors located in proximity to one another, they can be accorded the same threshold voltage, the value of which is imposed by the central setpoint generator 3.

It will be observed that, in this first example of the application of the invention, all the useful transistors 2-1 to 2-n can work permanently and are not disturbed by the adjusting of the voltage of their well.

In a second example of the application of the invention, it is assumed that it is desirable to operate a certain number of transistors of an integrated circuit at one and the same working point despite the disparities in their $I_{drain}/V_{gate}$ characteristic curves as a function of the locations of the transistors in the integrated circuit.

Figure 3:
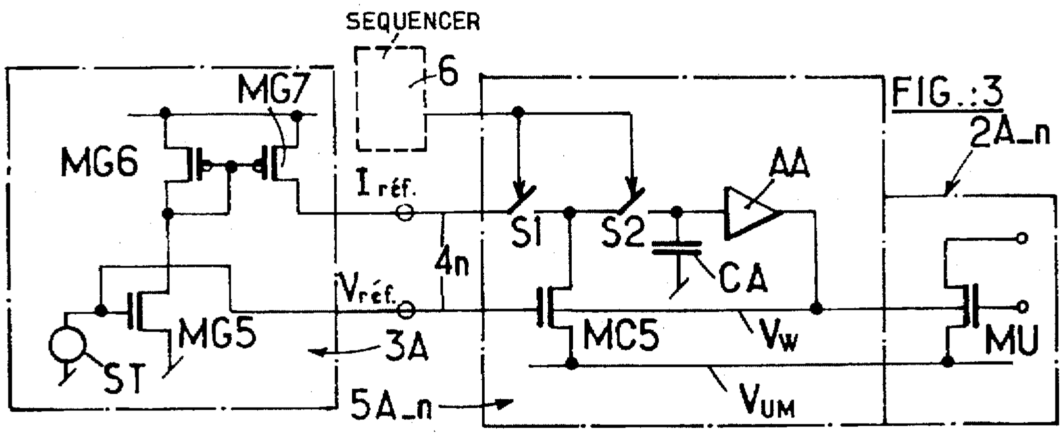
FIGS. 2 to 4 show three examples of the application of the invention.

Represented in FIG. 3 is a central setpoint generator 3A which generates in this case as setpoint, a reference voltage $V_{ref}$ and a reference current $I_{ref}$. Since here the sending of a current setpoint is involved, it is necessary to distribute this reference current $I_{ref}$ sequentially.

The setpoint generator 3A comprises a voltage source ST which is connected to the gate of a transistor MG5 and to an output of the generator delivering the reference voltage $V_{ref}$. The drain of the transistor MG5 is connected to a current mirror formed from the transistors MG6 and MG7, the latter delivering the reference current $I_{ref}$.

The local adjustment cell 5A-n includes a transistor MC5 whose gate receives the voltage $V_{ref}$. Its drain is linked up to two switches S1 and S2 controlled by the sequencer 6. The switch S1 receives the reference current $I_{ref}$ from the setpoint generator 3A. The switch S2 is connected to the common point of a capacitor CA and of an amplifier AA. The output of the latter is connected to the wells of the transistors MC5 and MU (2A-n).

When the cell 5A-n is in the adjustment phase, these switches S1 and S2 then being closed by the sequencer 6, the current $I_{ref}$ can reach the capacitor CA and the input of the amplifier AA. The voltage on the capacitor CA stabilizes when the current flowing through the transistor MC5 is equal to the reference current $I_{ref}$. The switches S1 and S2 can then be opened again, the capacitor CA storing the adjustment voltage at the input of the amplifier AA. The reference current $I_{ref}$ can then be dispatched to another local adjustment cell of the integrated circuit.

It is therefore seen that, in this case also, the useful transistor can continue to operate whether or not it is in the adjustment regime.

Figure 4:
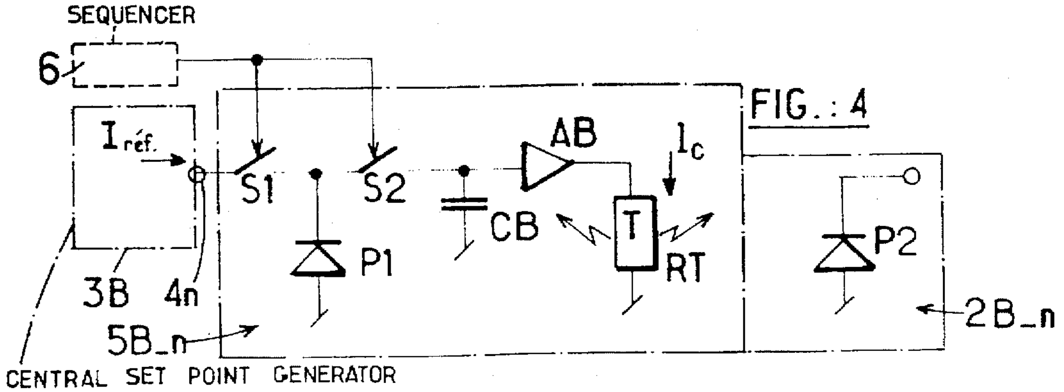

The third example of the application of the invention is represented in FIG. 4. Here, the useful components are not transistors but diodes or photodiodes, the latter possibly for example forming part of an array of detectors or the like. It may then be important for all these diodes to have the same leakage current. However, the leakage current of a diode is known to depend strongly on temperature.

The central setpoint generator 3B produces, for example by means of the setup represented in FIG. 3 at 3A, a reference current $I_{ref}$ which is distributed to the local adjustment cells, such as the cell 5B-n, by means of the sequencer 6.

The local adjustment cell 5B-n includes a diode P1 which is connected to the switches S1 and S2, these being closed in the adjustment regime. The switch S2 is also connected to the common point of a capacitor CB and of the input of an amplifier AB. The output of the latter is joined to a heat-dissipating resistor RT placed near the diode P1 and near the useful diode P2 (2B-n). A current $I_c$ is therefore dispatched as adjustment value into this dissipating resistor RT. The diode P2 (and possibly other diodes located in proximity) will thus receive a heat influx which determines one and the same leakage current for all the diodes.

The current flows in the dissipating resistor RT as long as the current in the diode P1 is not equal to the reference current $I_{ref}$. The sequencer 6 makes it possible to service other similar heating setups distributed over the array of photodiodes.

It should be noted that if the diodes P1 and P2 are identical (they are located in proximity to each other) and if only the photodiode P2 is exposed to light, this setup additionally allows control of the "dark" current of the photodiode P2.

Furthermore, the local adjustment cells must be thermally isolated from one another.

It should be noted that in this case also, the capacitor CB plays the role of memory and stores the setpoint value between two addressing operations performed by the sequencer 6.

I claim:

1. An integrated circuit which comprises:

central reference generator means for generating at least one setpoint item for determining an operating characteristic required to be common for a plurality of functional components of the integrated circuit;

a plurality of units, each unit including one of said functional components; means for distributing the setpoint item among said units each of said units comprising local adjustment means connected to receive said setpoint item and to generate an adjustment value, said local adjustment means including a device controlled as a function of said adjustment value;

correction means in each said unit for controlling the operating characteristic of said device as a function of said adjustment value, said device being placed in the proximity to said functional component of said unit and configured such that the operating characteristic which is imposed on said device is also imposed on said functional component.

2. The integrated circuit as claimed in claim 1, wherein said functional components include MOS transistors, each having a well voltage, and wherein said operating characteristic is the apparent threshold voltage of said MOS transistors.

3. The integrated circuit as claimed in claim 1, wherein said functional components include MOS transistors, and wherein said operating characteristic is a predetermined working point on the drain current/gate voltage curve of said MOS transistors.

4. The integrated circuit as claimed in claim 1, wherein said functional component in each of said units includes a diode or photodiode, and wherein said operating characteristic is the leakage current of said diode or photodiode.

5. The integrated circuit as claimed in claim 2, wherein said adjustment value is the well voltage of said MOS transistors.

6. The integrated circuit as claimed in claim 2, wherein said central reference generator means includes means for establishing a first ratio of two currents representative of the desired common value of said apparent threshold voltage and means for converting, as a function of a predetermined well voltage, said first ratio of currents into a pair of voltages forming said setpoint item, and wherein said local adjustment means of each said unit comprises means for locally establishing a second ratio of currents and means for producing, as a function of said setpoint item, a signal for modifying the well voltage of said MOS transistors of said functional component included in the relevant unit, in order to adjust said second ratio of currents to said first ratio of currents.

7. The integrated circuit as claimed in claim 6, wherein said means for establishing includes a current mirror including two MOS transistors having widths that have the same ratio as said first ratio of currents and two other MOS transistors mounted respectively in series with the transistors of the current mirror and having a well voltage equal to said predetermined well voltage value, said two other transistors being connected to operate under strong inversion and to yield said setpoint item at their gates, and wherein said local adjustment means of each of said units includes a structure identical to the above recited structure of said central reference generator means and an amplifier, the junction point between one of the transistors of the current mirror of said local adjustment means and said corresponding other transistor of said local adjustment means being connected to said amplifier, said amplifier generating said adjustment value, the output of said amplifier being connected to the wells of said other transistors of said local adjustment means and to that of the functional component associated with said local adjustment means.

8. The integrated circuit as claimed in claim 3, wherein said central reference generator means includes a voltage source delivering a reference voltage and a current source coupled to said voltage source for delivering a reference current, wherein said device included is said local adjustment means comprises a transistor connected in order to receive said reference voltage on its gate, and said local adjustment means further including an amplifier connected to amplify the difference between said reference current and the current flowing through said device, the output of said amplifier being connected to the well of said device and to the well of said functional component in order to supply them with said adjustment value.

9. The integrated circuit as claimed in claim 8, further including a sequencer for dispatching said reference current sequentially to said local adjustment means of each of said units, and wherein said local adjustment means each comprise memory means for preserving said adjustment value between two dispatches of said reference current to each local adjustment means.

10. The integrated circuit as claimed in claim 4, wherein said adjustment value is the temperature of said integrated circuit.

11. The integrated circuit as claimed in claim 10, wherein said central reference generator means comprises a reference current source, and wherein said local adjustment means each comprise a reference diode and an amplifier for amplifying the difference between the reference current and the current flowing in said reference diode, the output of said amplifier being connected to a heat dissipater component placed near said reference diode and near the diode or photodiode which forms said functional component.

12. The integrated circuit as claimed in claim 11, further including a sequencer for dispatching said reference current sequentially to each said local adjustment means.

13. The integrated circuit as claimed in claim 3, wherein said MOS transistors have a well voltage and, said adjustment value is the well voltage of said MOS transistors.

14. The integrated circuit as claimed in claim 5, wherein said central reference generator means includes means for establishing a first ratio of two currents for setting the desired common value of said apparent threshold voltage and means for converting, as a function of a predetermined well voltage value, said first ratio of currents into a pair of voltages forming said setpoint item, and wherein said local adjustment means of each said unit comprises means for locally establishing a second ratio of currents and means for producing, as a function of said setpoint item, a signal for modifying the well voltage of said MOS transistors of said functional component included in the relevant unit, in order to adjust said second ratio of currents to said first ratio of currents.

15. The integrated circuit as claimed in claim 5, wherein said central reference generator means includes a voltage source delivering a reference voltage and a current source coupled to said voltage source for delivering a reference current, wherein said device included in said local adjustment means comprises a transistor connected in order to receive said reference voltage on its gate, and said local adjustment means further including an amplifier connected to amplify the difference between said reference current and the current flowing through said device, the output of said amplifier being connected to the well of said device and to the well of said functional component in order to supply them with said adjustment value.

16. The integrated circuit as claimed in claim 13, wherein said central reference generator means includes a voltage source delivering a reference voltage and a current source coupled to said voltage source for delivering a reference current, wherein said device included in said local adjustment means comprises a transistor connected in order to receive said reference voltage on its gate, and said local adjustment means further including an amplifier connected to amplify the difference between said reference current and the current flowing through said device, the output of said amplifier being connected to the well of said device and to the well of said functional component in order to supply them with said adjustment value.

* * * * *